(12) United States Patent
Kamins et al.

(10) Patent No.: US 8,436,330 B2
(45) Date of Patent: May 7, 2013

(54) ELECTRICALLY ACTUATED DEVICES

(75) Inventors: Theodore I Kamins, Palo Alto, CA (US); R Stanley Williams, Portola Valley, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 159 days.

(21) Appl. No.: 13/121,918

(22) PCT Filed: Dec. 23, 2008

(86) PCT No.: PCT/US2008/088257
§ 371 (c)(1),
(2), (4) Date: Mar. 30, 2011

(87) PCT Pub. No.: WO2010/074688
PCT Pub. Date: Jul. 1, 2010

(65) Prior Publication Data
US 2011/0181352 A1    Jul. 28, 2011

(51) Int. Cl.
*H01L 29/02* (2006.01)

(52) U.S. Cl.
USPC .... 257/2; 257/5; 257/E45.002; 257/E21.498; 438/527; 438/530; 438/533; 438/468; 365/148; 365/163

(58) Field of Classification Search ........... 257/2, 5, 257/E45.002, E21.498; 438/27, 530, 533, 438/468; 365/148, 163
See application file for complete search history.

(56) References Cited

U.S. PATENT DOCUMENTS

| | | | |
|---|---|---|---|
| 2003/0062516 A1* | 4/2003 | Peterson | 257/4 |
| 2006/0109708 A1 | 5/2006 | Pinnow et al. | |
| 2008/0001172 A1 | 1/2008 | Karg et al. | |
| 2008/0090337 A1 | 4/2008 | Williams | |
| 2008/0239797 A1 | 10/2008 | Tsukamoto et al. | |

* cited by examiner

Primary Examiner — Tu-Tu Ho

(57) ABSTRACT

An electrically actuated device includes a first electrode, a second electrode, and an active region disposed between the first and second electrodes. At least two dopants are present in a spatially varying region of the active region prior to device actuation. The at least two dopants have opposite conductivity types and different mobilities.

13 Claims, 4 Drawing Sheets

A= ACCEPTOR
B= BACKGROUND DOPANT
D= DONOR ; B=D

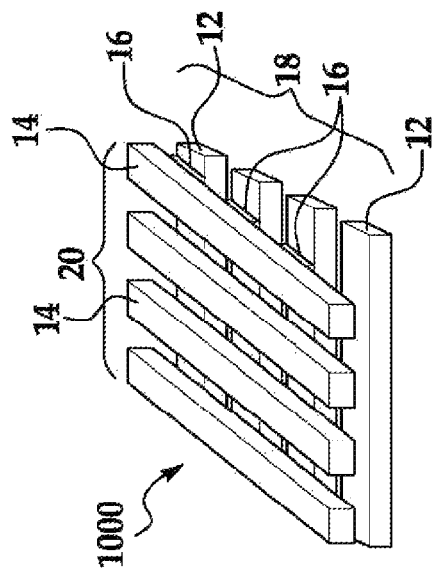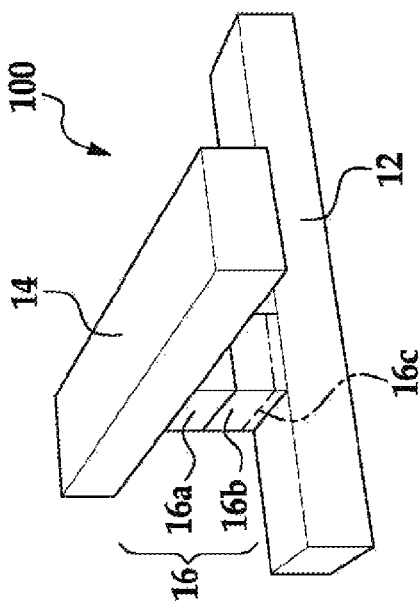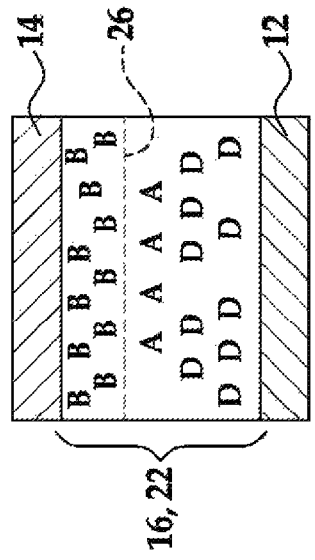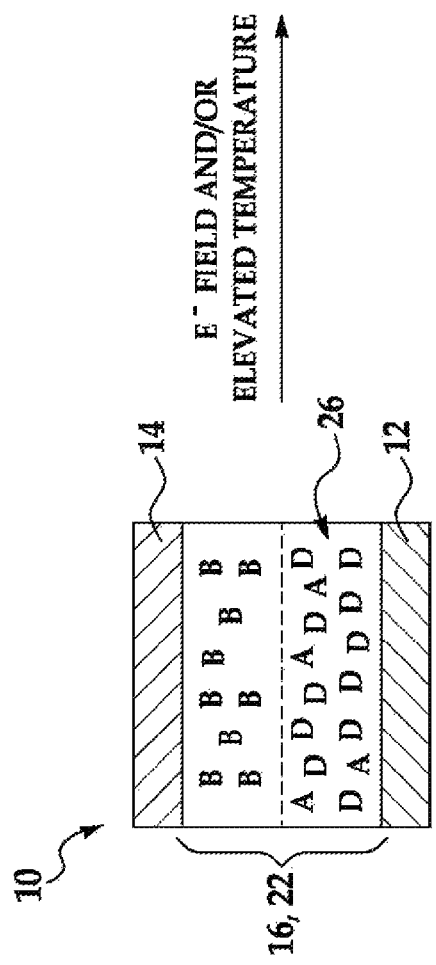

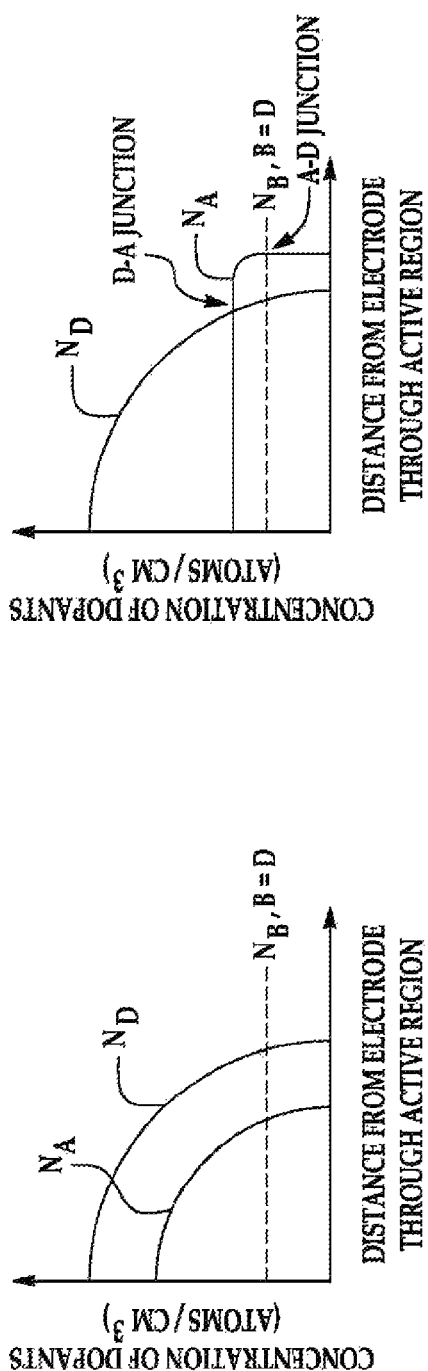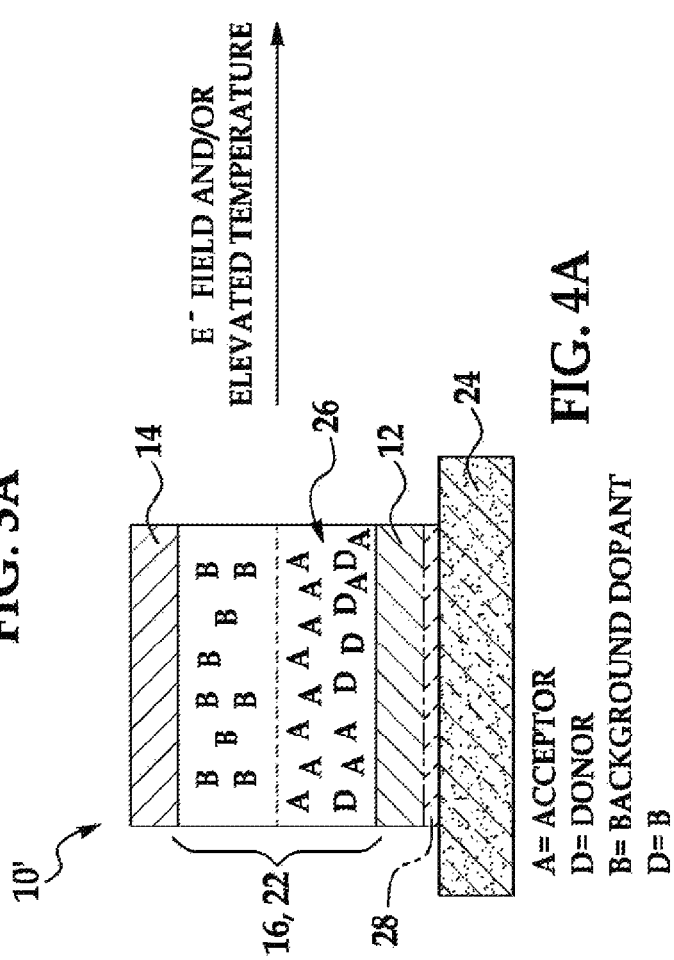

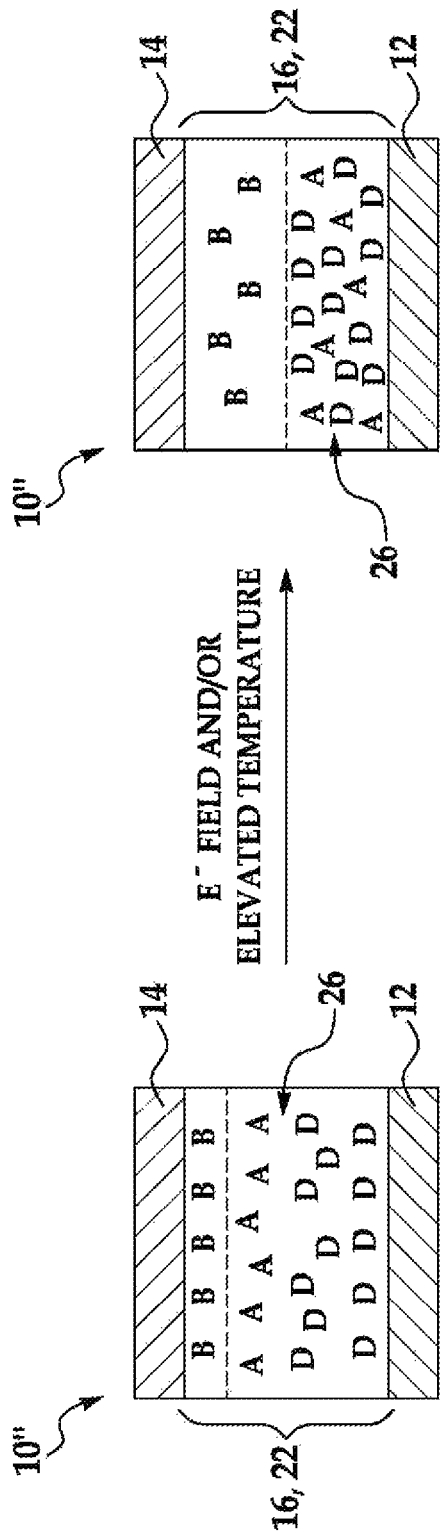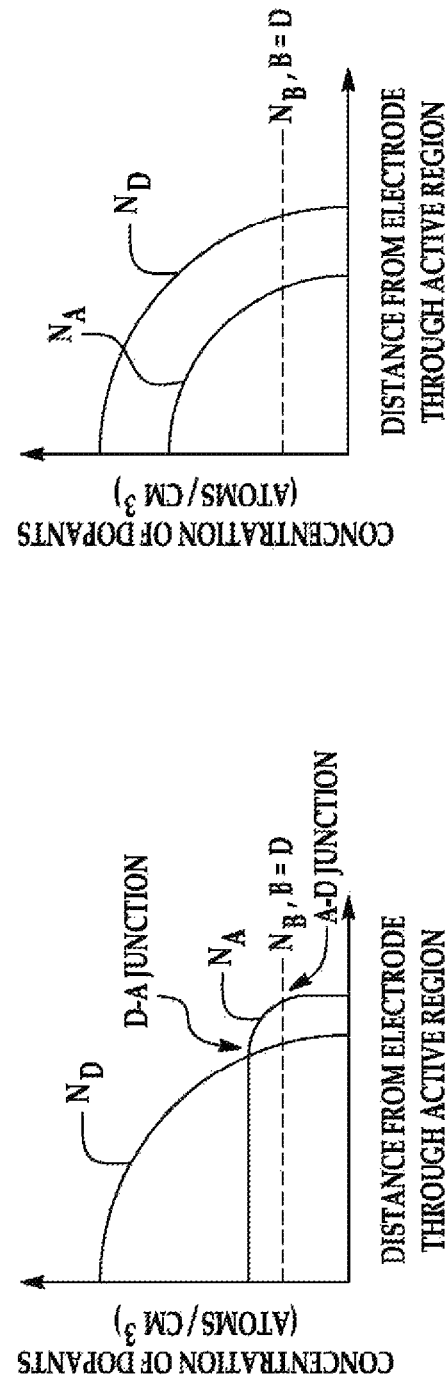

ELECTRICALLY ACTUATED DEVICES

BACKGROUND

The present disclosure relates generally to electrically actuated devices.

Nanometer-scale crossed-wire switching devices have previously been reported that could be switched reversibly and had an ON-to-OFF conductance ratio of about $10^3$. Such devices have been used to construct crossbar circuits and provide a promising route for the creation of ultra-high density nonvolatile memory. A latch (which is an important component for logic, circuits and for communication between logic and memory) has been fabricated from a series connection of crossed-wire switches. New logic families, constructed entirely from crossbar arrays of switches or as hybrid structures composed of switches and transistors, have also been described. These new logic families have the potential to dramatically increase the computing efficiency of CMOS circuits.

BRIEF DESCRIPTION OF THE DRAWINGS

Features and advantages of embodiments of the present disclosure will become apparent by reference to the following detailed description and drawings, in which like reference numerals correspond to the same or similar, though perhaps not identical, components. For the sake of brevity, reference numerals having a previously described function may or may not be described in connection with subsequent drawings in which they appear.

FIG. 1A is a perspective view of an embodiment of a solid-state electrically actuated switch connecting two different crossed wires;

FIG. 1B is a perspective view showing an array of the switches of FIG. 1A, also known as a crossbar;

FIG. 2A is a schematic cross-sectional view of an embodiment of the electronic device before device actuation, the electronic device including in its active region an initially dominant dopant and a background dopant having the same conductivity type;

FIG. 2B is a schematic cross-sectional view of the embodiment of the electronic device of FIG. 2A after device actuation;

FIG. 3A is a graph depicting the concentration of the dopants within the active region of the device of FIG. 2A;

FIG. 3B is a graph depicting the concentration of the dopants within the active region of the device of FIG. 2B;

FIG. 4A is a schematic cross-sectional view of another embodiment of the electronic device before device actuation, the electronic device including in its active region an initially dominant dopant and a background dopant having different conductivity types;

FIG. 4B is a schematic cross-sectional view of the embodiment of the electronic device of FIG. 4A after device actuation;

FIG. 6A is a schematic cross-sectional view of another embodiment of the electronic device before device actuation, the electronic device including in its active region an initially dominant dopant and a background dopant having the same conductivity type;

FIG. 6B is a schematic cross-sectional view of the embodiment of the electronic device of FIG. 6A after device actuation;

FIG. 7A is a graph depicting the concentration of the dopants within the active region of the device of FIG. 6A; and FIG. 7B is a graph depicting the concentration of the dopants within the active region of the device of FIG. 6B.

DETAILED DESCRIPTION

Figure 5A:
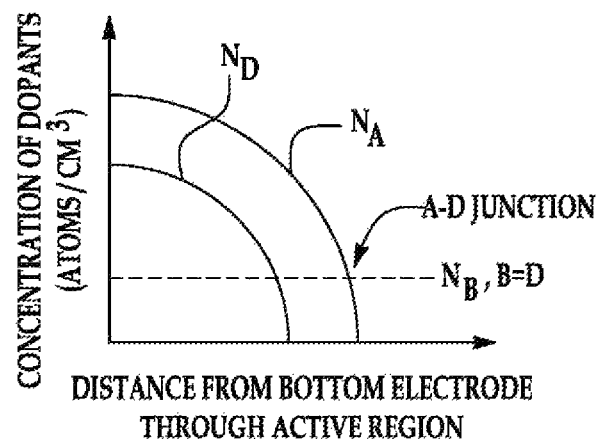
FIG. 5A is a graph depicting the concentration of the dopants within the active region of the device of FIG. 4A.

Embodiments of the device disclosed herein include an active region located between two electrodes. At least two dopants are localized within the active region, and the amount and distribution of such dopants may be tailored to achieve desirable junction properties, and thus desirable electrical properties.

In the embodiments disclosed herein, the at least two dopants have different mobilities. As such, the dopants will drift and/or diffuse at different rates through all or a portion of the active region under an electric field and/or an elevated temperature. Such movement will change the properties of the device. As such, during device programming (i.e., actuating or configuring), during device manufacturing, or subsequent to device manufacturing, the devices disclosed herein may be tailored to achieve desirable electrical properties.

Also in the embodiments disclosed herein, the at least two dopants have opposite conductivity types. As such, one or multiple p-n or n-p junctions may be formed within the active region upon diffusion and/or drift of the mobile dopants. The formation of p-n or n-p junctions will depend, at least in part, upon the concentration of each dopant, the mobility of each dopant (i.e., the mobility of the dopant atoms, not mobility of the charge carriers contributed by the dopant atoms), and the presence and concentration of any background dopant within the remainder of the active region. It is believed that multiple species may be utilized to achieve more complex electrical behavior.

In some embodiments, the device disclosed herein is reconfigurable, meaning that it can change its state multiple times via a reversible process. In other words, the devices disclosed herein can be opened and closed multiple times, such as the memory bits in a non-volatile random access memory (RAM). In other embodiments, the device disclosed herein may be singly configurable, meaning that it can change its state once via an irreversible process. Such a switch can be the basis of, for example, a programmable read only memory (PROM).

FIGS. 1A and 1B respectively depict a known solid-state electrically actuated switch 100 and a known cross-bar array 1000. In FIG. 1A, two different crossed wires or electrodes 12, 14 have a switch junction 16 therebetween. The switch junction 16 includes a primary active region 16a and a secondary active region 16b. In one embodiment, the primary active region 16a is a material that is both an electronically semiconducting and a weak ionic conductor that can be doped with electron donors, such as interstitials, vacancies, or impurities. In another embodiment, the material of the primary active region 16a is both nominally electrically insulating and a weak ionic conductor. The secondary active region 16b is a material that acts as a source and sink of the doping species. Furthermore, the secondary active region 16b is in series with, the primary active region 16a, and thus is conducting so that the switch 100 is able to conduct when the primary active region 16a is switched to the conducting state. As shown in FIG. 1A, the switch junction 16 may also include the molecular layer 16c as a covalently or non-covalently bonded interface region, where the molecular layer 16c includes molecules that may or may not be switchable. One or both electrodes 12, 14 may be metal or semiconductor materials. In some instances, both electrodes 12, 14 are metal.

The crossbar array 1000 may also be formed including a plurality of the solid-state electrically actuated switches 100 shown in FIG. 1A. As shown in FIG. 1B, a first layer 18 of approximately parallel electrodes 12 is overlain by a second layer 20 of approximately parallel electrodes 14. The second layer 20 may be roughly perpendicular, in orientation, to the electrodes 12 of the first layer 18. It is to be understood, however, that the orientation angle between the layers 18, 20 may vary. The two layers 18, 20 of electrodes 12, 14 form a lattice, or crossbar. Each electrode 14 of the second layer 20 overlies all of the electrodes 12 of the first layer 18, and comes into close contact with each electrode 12 of the first layer 18 at electrode intersections that represent the closest contact between two electrodes 12, 14. The switch junction 16 is shown disposed between electrodes 12, 14 at these contact points. While three such switch junctions 16 are shown, it is to be understood that a switch junction 16 is formed at each intersection of an electrode 12 with an electrode 14. Such crossbars 1000 may be fabricated from micron-, submicron- or nanoscale-wires, depending on the application.

Although individual electrodes 12, 14 in the figures are shown with square or rectangular cross-sections, electrodes 12, 14 may also have circular, elliptical, or more complex cross-sections. The electrodes 12, 14 may also have many different widths or diameters and aspect ratios or eccentricities. The term "crossbar" may refer to crossbars having one or more layers of sub-microscale electrodes, microscale electrodes or electrodes with larger dimensions, in addition to nanowires.

As is well known, such switches 100 may be used, as the basis for memories (e.g., the storage of a bit of information, 1 or 0), as either a closed or open switch in a cross-point memory, for configuration bits in a logic circuit that resembles a Field Programmable Gate. Array, or as the basis for a wired-logic Programmable Logic Array. These switches 100 also find uses in a wide variety of other applications. The embodiments of the device 10 (see FIGS. 2A' and 2B), 10' (see FIGS. 4A and 4B), and 10" (see FIGS. 6A and 6B) disclosed herein are similar to the switch 100.

Referring now to FIGS. 2A and 2B together, one embodiment of the electrical device 10 before and after device actuation is respectively depicted. The device 10 is similar to switch 100, and while not shown, it is to be understood that the active region 22 of device 10 may include primary and secondary active regions, similar to those regions described herein above for switch 100.

As shown, the device 10 includes first and second electrodes 12, 14, and an active region 22 established therebetween. The device 10 may be constructed laterally or vertically. In the example shown in FIGS. 2A and 2B, the device 10 is constructed vertically, and thus the electrodes 12, 14 are bottom and top electrodes, respectively. As previously mentioned, however, the device electrodes 12, 14 may be first and second electrodes within a lateral device 10. It is to be understood that any of the embodiments of the device 10, 10', 10" disclosed herein may be constructed vertically or laterally.

As non-limiting examples, the bottom electrode 12 (i.e., the first electrode) may be fabricated using conventional techniques, such as photolithography or electron beam lithography, or by more advanced techniques, such as imprint lithography. In one embodiment, the thickness of the bottom electrode 12 ranges from about 5 nm to about 30 nm; bottom electrode 12 may be any suitable conductive material, such as gold, platinum, tungsten, copper, etc.

As shown in FIGS. 2A and 2B, the active region 22 is established adjacent to the bottom electrode 12. The active region 22 functions as a switching junction of the device 10, similar to switching junction 16 briefly described hereinabove. In the embodiments disclosed herein, the active region 22 is capable of transporting and hosting dopants (electron acceptor dopants A, electron donor dopants D) to control the flow of electrons through the device 10. The basic mode of operation of the device 10 is to apply an electrical field across the device 10 (the drift field, which may exceed some threshold for enabling the motion of the dopants A, D in the active region 22) and/or an elevated temperature large enough to cause the dopant A, D with the higher mobility to be transported within the active region 22 via ionic transport. The mobile dopants A, D are generally species that change the electrical conductivity of, and form acceptor-donor (i.e. A-D, for example, p-n) or donor-acceptor (i.e., D-A, for example, n-p) junctions within, the active region 22. In a non-limiting example, the active region 22 may go from having zero or one p-n or n-p junction(s) to two or more p-n or n-p junctions after actuation. As such, the reconfiguration of the dopant profile under electric field and/or elevated temperature changes the electrical transport behavior of the device 10.

Non-limiting examples of suitable materials for the active region 22 include oxides, sulfides, selenides, nitrides, phosphides, arsenides, chlorides, and bromides of silicon, transition metals, rare earth metals, or alkaline earth metals. It is to be understood, however, that there is a wide range of materials that exhibit the desired combination of properties: electronically semiconducting or insulating and weak ionic conductor to enable the mobile dopants A, D to be injected by drift and/or diffusion into, ejected out of, and/or moved within the active region 22.

In general, any semiconducting material (making up active region 22) that is also a weak ionic conductor with respect to the mobile dopants A, D that can electrically dope the semiconductor will work in the embodiments disclosed herein. In other words, possible switch compounds for the active region 22 are semiconducting compounds with significant ionic contribution to the bonding. As a non-limiting example, the active region is $TiO_x$, where $x \leq 2$.

As previously mentioned, in one embodiment, the material for the active region 22 is selected from oxides, sulfides, selenides, nitrides, phosphides, arsenides, chlorides, and bromides of the transition and rare earth metals, with the alkaline earth metals often being present in compounds. Further, there are the various alloys of like compounds with each other, which offer a wide range of compositions if they are mutually soluble in each other. There are also mixed compounds, in which there are two, three or more different metal atoms combined with some number of the electronegative elements.

Materials for the active region 22 including the elements Ti, Zr and Hf are particularly attractive because they may be compatible with Si integrated circuit technology, since the primary oxidation state of all three metals is +4, the same as Si. As such, these elements would not create unintentional doping of the Si. Oxides of these compounds are also known as titania, zirconia, and hafnia, respectively, and also by other names specific to the various polytypes of each. Still another embodiment includes the alloys of these three oxides in pairs or with all three present simultaneously (e.g., $Ti_xZr_yHf_zO_2$, where $x+y+z=1$). Related sets of compounds include the titanates, zirconates and hafnates, which are represented by the specific example $SrTiO_3$, where Sr is the divalent element strontium. There is a wide variety of such compounds in which Ca, Ba, and other divalent elements (e.g., Mg, Zn, Cd) may be substituted for Sr, and Zr and Hf substituted for Ti.

These compounds may be represented as $ABO_3$ compounds, where A is at least one divalent element and B is at least one of Ti, Zr, and Hf, and may have the perovskite structure.

It is also possible to utilize alloys of these various compounds, such as $Ca_aSr_bBa_cTi_xZr_yHf_zO_3$, where $a+b+c=1$ and $x+y+z=1$. There is also a wide variety of other oxides of the transition and rare earth metals with different valences that may be used, both individually and as more complex compounds.

Yet another embodiment of compounds suitable for the active region 22 includes the sulfides and selenides of the transition metals with some ionic bonding character, essentially the S and Se analogues of the oxides mentioned above. Still another embodiment of compounds suitable for the active region 22 includes the semiconducting nitrides, such as AlN, GaN, ScN, YN, LaN, rare earth nitrides, and alloys of these compounds and more complex mixed metal nitrides. A still further embodiment of compounds suitable for the active region 22 includes the semiconducting halides (such as CuCl, CuBr, and AgCl), or the phosphides and arsenides of various transition and rare earth metals, e.g., Sc, Y, La, etc.

It is to be further understood that the active region 22 may include sublayers of different materials or compounds chosen from the examples above.

Prior to device actuation (FIG. 2A), the active region 22 includes a spatially varying region 26 having the at least two mobile dopants A, D therein. In this state, the dopants A, D within the spatially varying region 26 are generally spatially non-uniform, as shown, in FIG. 2A. As previously mentioned, it is to be understood that the dopants A, D are selected to impart opposite conductivity types and have different mobilities. In one example, when two different dopants A, D are used, one A is of p-type conductivity and has a first mobility, and the other D is of n-type conductivity and has a second mobility that is different than the first mobility. In another example, when four different dopants A, D are used, two dopants A may be of p-type conductivity and have first and second mobilitites, and the other two dopants D may be of n-type conductivity and have third and fourth mobilitites. Mobilities of at least some of these dopants A, D are different from mobilities of other of the dopants D, A. In some instances, all four mobilities are different. It is to be understood that the number of dopants ($A_n$, $D_n$, where n=a positive integer) used beyond the initial two different dopants A, D depends upon desirable device 10 characteristics.

Non-limiting examples of suitable dopants A, D for a titanium dioxide active region 22 are provided herein. In one example, Mg and Ca are p-type dopants A, as they increase hole density, while Be is an n-type dopant D, as it increases electron density. It is to be understood that the dopants A, D selected will depend, at least in part, on the material selected for the active region 22, and that n-type and/or p-type dopants A, D other than those listed may be utilized.

It is to be further understood that the dopant A, D selected to have the higher mobility will depend on, at least in part, i) which, if any, of the dopants A, D is an initially dominant dopant and/or ii) any desirable characteristics for the device 10 upon actuation. When discussing the dopants A, D, it is to be understood that the net donor or acceptor concentration is generally of interest. The phrase "initially dominant dopant", as used herein, refers to the dopant A, D having a higher concentration throughout the spatially varying region 26 prior to device 10 actuation, and the phrase "initially non-dominant dopant", as used herein, refers to the dopant D, A having a lower concentration throughout the spatially varying region 26 prior to device 10 actuation. After device 10 actuation, it is to be understood that the phrases "dominant" and "non-dominant" dopants may, in some instances, no longer be appropriate, as the respective dopants A, D move so that the respective concentrations are greater in different portions of the active region 22. Generally, when the initially dominant dopant A, D has a higher concentration throughout spatially varying region 26 and the initially dominant dopant type is the same type as a background dopant (discussed further hereinbelow), the device 10 begins with zero junctions, the number of which is increased upon actuation (see, e.g., FIGS. 2A, 2B, 3A, 3B, 4A, 4B, 5A, and 5B).

It is to be understood, however, that depending, at least in part, upon the localization of the higher concentration of dopant A, D in the spatially varying region 26, the device 10 may begin with one or more p-n or n-p junctions, the number of which is reduced upon actuation (see, e.g., FIGS. 6A, 6B, 7A, and 7B). In such instances, the phrases "dominant" and "non-dominant" may not be appropriate, at least in part because the spatially varying region 26 has one portion having a higher concentration of one of the dopants A and another portion having a higher concentration of the other of the dopants D.

The selection of the initial spatial distribution of the dopants A, D and their concentrations will depend, at least in part, upon desirable device 10 characteristics and any background dopant B selected for the active region 22. As briefly mentioned hereinabove, the embodiments shown in FIGS. 2A and 3A illustrate an initially dominant dopant being present throughout the spatially varying region 26 prior to device 10 actuation.

It is to be understood that the background dopant B (discussed further hereinbelow) may be considered when identifying the initially dominant dopant, if, for example, the background dopant B is not negligible compared to one or both of the dopants A, D. For example, if the concentration of the background dopant B is not much less than the added concentration of the same dopant type in the spatially varying region 26 (either dopant A or dopant D), the total donor or acceptor concentration may be used when calculating the electrical behavior of the device 10.

The background dopant (shown in FIGS. 2A and 2B) for the active region 22 has the same conductivity type as the conductivity type of one of the at least two dopants A, D. In instances where the background dopant B is the same conductivity type as the initially dominant dopant, the active region 22 has no A-D (i.e., p-n) or D-A (i.e., n-p) junctions prior to device 10 actuation. In the example in FIG. 2A, the background dopant B has the same n-type conductivity as the initially dominant dopant prior to actuation (in this example, dopant D), and thus no junctions are initially present in the device 10 (see FIG. 3A). In other instances (see, e.g., FIG. 4A) where the background dopant B is a different conductivity type than the initially dominant dopant, the active region 22 has one A (i.e., p-n) or D-A (i.e., n-p) junction prior to device 10' actuation. An example of this is shown in FIG. 4A, in which the background dopant B has the opposite conductivity type from the initially dominant dopant prior to actuation (in this example, p-type dopant A), and thus one A-D junction is formed in the device 10' prior to actuation (see FIG. 5A). The function of the device 10' shown in FIG. 4A will be described further hereinbelow.

Specifically referring back to FIG. 2A, while the initially non-dominant dopants (in this example, the p-type dopants A) are present in the spatially varying region 26, the concentration of such dopants A is lower than the concentration of the initially dominant dopant D throughout the region 26, and an A-D (i.e., p-n) junction is not yet formed in the device 10. Since the background dopant B of the remainder of the active region 22 has the same conductivity type (in this example, the n-type conductivity) as the initially dominant dopant D in the spatially varying region 26, it is desirable that the mobility of the initially dominant dopant D be lower than the mobility of the initially non-dominant dopant A. The higher mobility of the initially non-dominant dopant A enables this dopant A, upon device 10 actuation, to move at a faster rate than the initially dominant dopant D. As such, when exposed to a predetermined electric field and/or heat (as shown in FIG. 2B), the initially non-dominant p-type dopant A will drift and/or diffuse through the active region 22 quicker than the initially dominant n-type dopant D. Such movement causes the initially non-dominant dopants A to reposition and spread within the active region 22 so that the concentration of dopants A is greater than the concentration of dopants D in a portion of the active region 22 (e.g., between regions with higher concentrations of n-type dopants B and D), thereby moving the spatially varying region 26 and forming two or more junctions. In this particular example, the resulting device 10, shown in FIGS. 2B and 3B, has an n-p-n structure in the active region 22.

It is to be understood that if the initially non-dominant dopant A, in this example, had a slower mobility, the initially dominant dopant concentration would not be reduced below that of the initially non-dominant dopant within the spatially varying region 26 after actuation, and a continuous n-type region would be retained, with no A-D (i.e., p-n) junction(s) formed upon actuation. In such an instance, the initially dominant dopant D would drift and/or diffuse quicker than the initially non-dominant dopant A, thereby enabling the initially dominant dopants D to maintain a continuous n-type region with the background dopants B of the same conductivity type between the two electrode/active region interfaces (depending on the electric field applied).

Once actuated, the device 10 remains in a particular state until it is re-actuated. Generally, the time and field/temperature are too low to cause significant dopant motion during electronic operation when the programming voltage/temperature is not applied (as opposed to configuring or reconfiguring).

In an embodiment of the method of forming the device 10, suitable deposition techniques for the active region 22 include conventional physical and chemical techniques, including evaporation from a heated source, such as a filament or a Knudsen cell, electron beam (i.e., e-beam) evaporation from a crucible, sputtering from a target, other forms of evaporation, chemical vapor deposition (CVD), molecular beam deposition, atomic layer deposition, or various other forms of chemical vapor or beam growth from reactive precursors. Appropriate deposition or growth conditions, such as speed and temperature, may be selected to achieve the desirable chemical composition and local atomic structure desired for the active region 22. The background dopant B is typically deposited as the active region 22 is established, although other methods of establishing the background dopant B may be utilized. For example, the background dopant B may be oxygen vacancies formed during the deposition of a $TiO_x$ active region 22.

In some instances, the dopants A, D, are introduced into the device 10 during or after the establishment of the active region 22. It may be possible to introduce the dopants A, D into a separate, adjacent region (not shown), and then move the dopants A, D into the active region 22 during device 10 programming. When introduced from a separate region, such introduction may take place either during or after the region 22 has been established adjacent to the electrode 12. This depends, at least in part, on the geometry of the device 10 (e.g., whether the active region 22 is below or above or laterally adjacent to the separate region containing the dopants A, D). Some non-limiting examples of techniques suitable for introducing the dopants A, D to the device 10 include the following: i) implanting one or more of the dopants A, D into the active region 22 or a region directly or indirectly adjacent thereto; or ii) diffusing one or more of the dopants A, D from a gaseous source or precursor into the active region 22 or a region directly or indirectly adjacent thereto (during, after, or in some instances before, establishment of the active region 22); or iii) implanting one or more of the dopants A, D into a region (not shown) adjacent to the established active region 22 and then diffusing the one or more of the dopants A, D from the adjacent region.

Once the active region 22 and dopants A, D are established, the top electrode 14 (i.e., second electrode) is established on the active region 22. The top electrode 22 may be the same material as or a different material than the bottom electrode 12, and may be established via the same or a different technique than that used to establish the bottom electrode 12. In one example, the top electrode 14 is evaporated with an electron beam evaporator. The thickness of the top electrode also generally ranges from about 5 nanometers to as many as hundreds of nanometers.

As previously mentioned, the device 10 may be actuated by exposure to a predetermined electric field and/or an elevated temperature. In some instances, the electric field is applied when the temperature is elevated. In other instances, the temperature elevates as a result of current flowing through the device 10 (e.g., self-heating). The electric field applied and/or the temperature obtained will depend, at least in part, on the dopants A, D selected, their concentrations, and their configuration in the spatially varying region 26.

Once the mobility of the dopant A, D is known and the desired programming time is determined (based, at least in part on circuit and system considerations, within physical constraints), the field can be selected to move the dopants A, D through the desired thickness and/or width of the active region 22 within the desired programming time. In some instances, the field will be selected such that the time for moving the dopant A, D is, on average, within a fraction, such as half or one fourth, of the programming time to allow for process variations. The drift time is the distance divided by the velocity. The velocity is the mobility times the electric field. The mobility depends, at least in part, on temperature. In some instances, this relationship may be expressed as an activated process where $\mu=\mu_0 \exp(-E_a/kT)$. The diffusion coefficient often also has this type of exponential temperature dependence, and mobility is related to the diffusion coefficient (generally by a factor of q/kT from the Einstein equation); as such, a similar exponential temperature dependence may be seen for diffusion.

During the device 10 actuation, the dopant A, D having the higher mobility will drift (due to the electric field) and/or diffuse (due to the elevated temperature) within the active region 22. As shown in FIG. 2B, such movement may form one or more A-D (i.e., p-n) or D-A (i.e., n-p) junctions. As discussed further hereinbelow, such movement may also reduce the number of junctions in the device.

Graphs depicting the concentrations $N_A$, $N_D$, $N_B$ of the dopants A, D, B through the active regions 22 of FIGS. 2A and 2B are respectively shown in FIGS. 3A and 3B. While the distance illustrated in these graphs is through the active region 22 from the bottom electrode 12, it is to be understood that the configurations of the active region 22 may be altered so that the concentrations $N_A$, $N_D$, $N_B$ are shown with respect to the distance from any electrode in the device. As previously explained, in this example, the p-type dopant A has a lower concentration $N_A$ than n-type dopant D in the spatially varying region 26, as shown in FIG. 3A. Since the conductivity types of dopants B and D are the same, no A-D (i.e., p-n) junctions are formed. However, during device actuation, the p-type dopants A move through the active region 22 such that at some distance from one of the electrodes 12, 14, the concentration $N_A$ of the p-type dopant A is greater than the concentration $N_D$ of the n-type dopant D plus the background n-type dopant B. As shown in FIG. 3B, a D-A (i.e., n-p) junction is formed at a first distance from the electrode 12, 14 in the active region 22. In this example, this junction is formed at the distance where $N_A = N_D + N_B$. Likewise, the concentration $N_A$ of the p-type dopant A is greater than the concentration $N_B$ of the n-type background dopant B in a region beyond the first distance, and thus another A-D (i.e., p-n) junction is formed in the active region 22 at another distance beyond the first distance from the electrode 12, 14. In this example, this second junction is formed at the distance where $N_A = N_B$.

While not shown in FIGS. 2A and 2B, it is to be understood that either of the electrodes 12, 14 may be established on a substrate. Generally, when the substrate is utilized, it is an insulating substrate, such as silicon dioxide, silicon nitride, glass, aluminum oxide, sapphire (i.e., crystalline aluminum oxide), some organic films that are stable at higher temperatures (e.g., polyimide), or the like. It is generally desirable to use a substrate formed of a lower-permittivity dielectric material.

Referring now to FIGS. 4A and 4B, another embodiment of the electrical device 10' before and after device actuation, respectively, is depicted. As shown, the device 10' includes the top and bottom electrodes 12, 14 and an active region 22 therebetween. It is to be understood that the materials and techniques described in reference to FIGS. 2A and 2B may be utilized for the embodiment disclosed in FIGS. 4A and 4B.

In this example, an adhesion layer 28 is shown established directly on a substrate 24, and the bottom electrode 12 is established on the adhesion layer 28. Generally, the adhesion layer 28 enhances the bond between the substrate 24 and the subsequently established bottom electrode 12. In some instances, the adhesion layer 28 may be a source of at least one of the dopants A, D for the active region 22, which diffuse through the bottom electrode 12 when exposed to certain conditions. Non-limiting examples of suitable materials for the adhesion layer 28 include titanium or chromium. It is believed other like materials may also be suitable. The adhesion layer 28 may be established on the substrate 24 via any suitable technique, such as, for example, sputtering, electron-beam evaporation, molecular beam deposition, chemical vapor deposition (CVD), or atomic layer deposition (ALD). It is to be understood, as shown in the embodiment of FIGS. 2A and 2B, that the adhesion layer 28 may be omitted if desirable. It is to be further understood that when the layer 28 is used solely as a source of the dopants A, D, such layer 28 may be positioned adjacent to any electrode 12, 14 (or a side electrode, not shown).

This embodiment of the device 10' (prior to actuation) includes the acceptor (p-type) dopant A as the initially dominant dopant in the spatially varying region 26, the donor (n-type) dopant D as the initially non-dominant dopant in the spatially varying region 26, and an n-type dopant as the background dopant B for the active region 22. As such, the background dopant B has a different conductivity type than the initially dominant dopant (in this instance p-type dopant. A), and the active region 22 has one A-D or D-A junction prior to device 10 actuation (see FIG. 5A) formed between the initially dominant dopant A and the background dopants B.

While the initially non-dominant dopants (in this example, the n-type dopants D) are present in the spatially varying region 26, such dopants D plus the background dopant B have a lower concentration than the concentration of p-type dopants A throughout the spatially varying region 26, and a p-n (also referred to herein as A-D) junction is formed in the device 10 between the initially dominant and background dopants A, B. It is to be understood that the Y-axis on FIGS. 3A, 3B, 5A and 5B is usually logarithmic, and thus the concentrations of dopants A and D shown are much higher than the concentration of background dopant B. In such instances, the background dopant B may be ignored. In other instances, for example, when the concentration of the background dopant B is similar to one or both of the dopants A, D, the background dopant B may not be ignored and the total concentration of n-type or p-type dopants is considered (see, e.g., FIGS. 6A, 6B, 7A, and 7B).

Since the background dopant B of the remainder of the active region 22 has a different conductivity type (in this example, the n-type conductivity) as the initially dominant dopant A in the spatially varying region 26, it is desirable that the mobility of the initially dominant dopant A be higher than the mobility of the initially non-dominant dopant D. The higher mobility of the initially dominant dopant A enables this dopant A, upon device 10 actuation, to move at a faster rate than the initially non-dominant dopant D. As such, when exposed to a predetermined electric field and/or heat (as shown in FIG. 4B), the initially dominant p-type dopant A will drift and/or diffuse within the active region 22 quicker than the initially non-dominant n-type dopant D. Such movement causes the initially dominant dopants A to reposition within the active region 22, thereby reducing the concentration of the initially dominant dopant A near one of the electrode/active region interfaces below the concentration of the slower moving initially non-dominant dopant D. In this case, there is a region with a higher concentration of the initially non-dominant dopant D near one of the electrode/active region interfaces and a region with a higher concentration of the initially dominant dopants A between the region with higher concentration of n-type dopants D and the region dominated by the background dopants B. Such movement shifts the spatially varying region 26 and forms an additional A-D (i.e., p-n) junction in, the active region 22. In this particular example, the resulting device 10' has an n-p-n structure in the active region 22 (see FIGS. 4B and 5B).

Figure 5B:
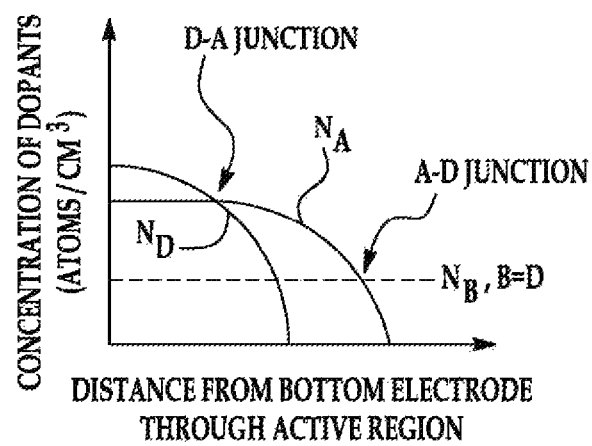
FIG. 5B is a graph depicting the concentration of the dopants within the active region of the device of FIG. 4B.

Graphs depicting the concentrations $N_A$, $N_D$, $N_B$ of the dopants A, D, B through the active regions 22 of FIGS. 4A and 4B are respectively shown in FIGS. 5A and 5B. While the distance illustrated in these graphs is through the active region 22 from the bottom electrode 12, it is to be understood that the configurations of the active region 22 may be altered so that the concentrations $N_A$, $N_D$, $N_B$ are shown with respect to the distance from any electrode in the device. As previously explained, p-type dopant A has a higher concentration $N_A$ than n-type dopant D plus the background dopant B in the spatially varying region 26, as shown in FIG. 5A. Since the conductivity types of dopants B and A are different, one p-n (i.e., A-D) junction is initially present. During device 10' actuation, the p-type dopants A move within the active region 22 such that at some distance from one of the electrodes 12, 14, the net n-type dopant concentration $N_D$ plus $N_B$ become greater than the concentration $N_A$ of the p-type dopant A, and at some further distance, the concentration $N_A$ of the p-type dopant A becomes greater than the net n-type dopant concentration $N_D$ plus $N_B$. As shown in FIG. 5B, a second D-A (i.e., n-p) junction is formed at the distance from the electrode 12, 14 in the active region 22 where the concentrations $N_A$ and $N_D$ plus $N_B$ shift. Likewise, the concentration $N_A$ of the p-type dopant A is greater than the concentration $N_B$ of the n-type background dopant B, and thus the initially present A-D (i.e., p-n) junction remains in the active region 22 of the actuated device 10' although at a different position.

Referring now to FIGS. 6A, 6B, 7A and 7B, an embodiment of the device 10" is depicted in which, prior to device 10" actuation, two junctions (an n-p (D-A) junction and a p-n (A-D) junction) are formed in the active region 22. In this embodiment, prior to actuation, one of the dopants D has a higher concentration in one portion of the spatially varying region 26, while the other of the dopants A has a higher concentration in another portion of the spatially varying region 26 (see, e.g., FIGS. 6A and 7A).

In this example, the dopants D may have higher mobility than the dopants A, as it is desirable to reduce the number of junctions upon device 10" actuation. As such, the application of the electric field and/or elevated temperature moves the dopants D until the concentration of dopants D is higher than the concentration of dopants A throughout the spatially varying region 26 (see, e.g., FIGS. 6B and 7B). In another example, the dopants A may have lower energy when in the presence of dopant D as compared to when they are localized in another region. In such instances, the dopants A are attracted to the region that is dominated by the dopants D when the field and/or temperature is applied. As shown in FIGS. 6B and 7B, once the concentration $N_D$ of the dopants D is higher throughout the spatially varying region 26, the junctions in the device 10" disappear.

In another embodiment, the concentration of dopant A in FIG. 7A is moderately higher than the concentration of background dopant B, and the mobility of dopant A is higher than the mobility of dopant D. When the electric field and/or elevated temperature is applied, the dopant A moves into the region where only the background dopant B is present until the concentration of dopant A is lower than the concentration of background dopant B throughout the structure. Thus, the initially present junctions are removed, and there is a continuous n-type region from one electrode 12 to the other 14.

It is to be understood that when the term "p-n junction" is used herein and throughout the claims, it may also mean an n-p junction. It is to be further understood that the configuration (n-p or p-n) of the particular junction will depend upon the spatial configuration of the p-type and n-type dopants within the active region 22.

While several embodiments have been described in detail, it will be apparent to those skilled in the art that the disclosed embodiments may be modified. Therefore, the foregoing description is to be considered exemplary rather than limiting.

What is claimed is:

1. An electrically actuated device, comprising:
   a first electrode;
   a second electrode;
   an active region disposed between the first and second electrodes; and
   at least two dopants present in a spatially varying region of the active region prior to device actuation, the at least two dopants having opposite conductivity types and different mobilities;
   wherein one of the at least two dopants is initially dominant in the spatially varying region, wherein the active region has a background conductivity type that is the same as the conductivity type of the initially dominant one of the at least two dopants, and wherein the active region has no junctions prior to device actuation.

2. The electrically actuated device as defined in claim 1 wherein the initially dominant one of the at least two dopants has a higher concentration than an other of the at least two dopants in the spatially varying region.

3. The electrically actuated device as defined in claim 1 wherein subsequent to device actuation, the device has two p-n junctions.

4. The electrically actuated device as defined in claim 1 wherein the initially dominant one of the at least two dopants has a lower mobility or a lower diffusion coefficient than an other of the at least two dopants.

5. The electrically actuated device as defined in claim 4 wherein when exposed to an electric field:
   the at least two dopants are to drift through the active region at different rates to form two p-n junctions; and
   the other of the at least two dopants is to reposition and spread within the active region so that a concentration of the other of the at least two dopants is greater than a concentration of the initially dominant one of the at least two dopants in a portion of the active region.

6. The electrically actuated device as defined in claim 4 wherein when exposed to an electric field at an elevated temperature:
   the at least two dopants are to drift through the active region at different rates to form two p-n junctions; and
   the other of the at least two dopants is to reposition and spread within the active region so that a concentration of the other of the at least two dopants is greater than a concentration of the initially dominant one of the at least two dopants in a portion of the active region.

7. The electrically actuated device as defined in claim 1 wherein actuation of the device is reversible under at least a predetermined electric field.

8. the electrically actuated device as defined in claim 1 wherein:
   the conductivity type of the initially dominant one of the at least two dopants and the background conductivity type are n-type; and
   the conductivity type of an other of the at least two dopants is p-type.

9. An electrically actuated device, comprising:
   a first electrode;
   a second electrode;
   an active region disposed between the first and second electrodes; and
   at least two dopants present in a spatially varying region of the active region prior to device actuation, the at least two dopants having opposite conductivity types and different mobilities;
   wherein one of the at least two dopants is initially dominant in the spatially varying region, wherein the active region has a background conductivity type that is different than the conductivity type of the initially dominant one of the at least two dopants, wherein the active region has one p-n junction prior to device actuation, and wherein subsequent to device actuation, the device has two p-n junctions.

10. An electrically actuated device, comprising:
   a first electrode;
   a second electrode;
   an active region disposed between the first and second electrodes; and at least two dopants present in a spatially varying region of the active region prior to device actuation, the at least two dopants having opposite conductivity types and different mobilities;

wherein prior to device actuation, at least one p-n junction is present in the device, and wherein subsequent to device actuation a number of the initially present p-n junctions in the device is reduced.

11. A method for making an electrically actuated device, the method comprising:

introducing a first dopant into a spatially varying region of an active region;

introducing a second dopant into the spatially varying region of the active region, the first and second dopants having opposite conductivity types and different mobilities; and exposing the active region to at least one of an electric field or an elevated temperature, thereby causing the first and second dopants to at least one of drift or diffuse through an additional portion of the active region at different rates to form at least two junctions in the active region.

12. The method as defined in claim 11 wherein prior to exposing, the method further comprises:

establishing the active region between a first electrode and a second electrode; and introducing the first and second dopants simultaneously with establishing the active region or after establishing the active region, wherein introducing each of the first and second dopants is individually accomplished by i) implanting at least one of the first and second dopants into the active region or a region directly or indirectly adjacent thereto; or ii) diffusing at least one of the first and second dopants from a gaseous source or precursor into the active region or a region directly or indirectly adjacent thereto; or iii) implanting at least one of the first or second dopants into a region adjacent to the established active region and then diffusing the at least one of the first or second dopants from the adjacent region.

13. The method as defined in claim 11 wherein introducing the first and second dopants includes introducing one of the first or second dopants as an initially dominant dopant and an other of the second or first dopants as an initially non-dominant dopant in the spatially varying region, and wherein prior to introducing the first and second dopants, the method further comprises:

i) doping the active region to have a background conductivity type that is the same as the conductivity type of the initially dominant dopant, such that the active region has no junctions prior to the exposing step; or ii) doping the active region to have a background conductivity type that is different than the conductivity type of the initially dominant dopant, such that the active region has one p-n junction prior to the exposing step.

* * * * *

UNITED STATES PATENT AND TRADEMARK OFFICE
CERTIFICATE OF CORRECTION

PATENT NO. : 8,436,330 B2
APPLICATION NO. : 13/121918
DATED : May 7, 2013
INVENTOR(S) : Kamins et al.

Page 1 of 1

It is certified that error appears in the above-identified patent and that said Letters Patent is hereby corrected as shown below:

In the spec. in col. 12 line 38 claim 8, delete "the" and insert --The--.

Signed and Sealed this
First Day of October, 2013

Teresa Stanek Rea
*Deputy Director of the United States Patent and Trademark Office*